US012804936B2

(12) United States Patent
Kavrik et al.

(10) Patent No.: US 12,804,936 B2
(45) Date of Patent: Nov. 17, 2026

(54) TRANSFER-FREE 2D FET AND FEFET DEVICE FABRICATION BY 2D MATERIAL GROWTH IN SUPERLATTICE WITH NITRIDES

(71) Applicant: Intel Corporation, Santa Clara, CA (US)

(72) Inventors: Mahmut Sami Kavrik, Eugene, OR (US); Tristan Tronic, Aloha, OR (US); Chelsey Dorow, Portland, OR (US); Kevin O'Brien, Portland, OR (US); Uygar Avci, Portland, OR (US); Carl H. Naylor, Portland, OR (US); Chia-Ching Lin, Portland, OR (US); Dominique Adams, Portland, OR (US); Matthew Metz, Portland, OR (US); Ande Kitamura, Portland, OR (US); Scott B. Clendenning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 83 days.

(21) Appl. No.: 18/091,209

(22) Filed: Dec. 29, 2022

(65) Prior Publication Data

US 2024/0222485 A1 Jul. 4, 2024

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/80*** | (2025.01) |
| ***H10D 84/83*** | (2025.01) |
| ***H10D 99/00*** | (2025.01) |

(52) U.S. Cl.

CPC ......... *H10D 30/43* (2025.01); *H10D 30/6735* (2025.01); *H10D 62/121* (2025.01); *H10D 62/80* (2025.01); *H10D 84/83* (2025.01); *H10D 99/00* (2025.01)

(58) Field of Classification Search

None

See application file for complete search history.

(56) References Cited

U.S. PATENT DOCUMENTS

2024/0107903 A1* 3/2024 Lin ........................ H10D 99/00

OTHER PUBLICATIONS

Geim, A. K., et al., "Van der Waals heterostructures", Nature, Jul. 25, 2013, vol. 499, pp. 419-425.

* cited by examiner

*Primary Examiner* — Anthony Ho

(74) *Attorney, Agent, or Firm* — Essential Patents Group, LLP

(57) ABSTRACT

A transistor structure includes a stack of nanoribbons coupling source and drain terminals. The nanoribbons may each include a pair of crystalline interface layers and a channel layer between the interface layers. The channel layers may be a molecular monolayer, including a metal and a chalcogen, with a thickness of less than 1 nm. The channel layers may be substantially monocrystalline, and the interface layers may be lattice matched to the channel layers. The channel layers may be epitaxially grown over the lattice-matched interface layers. The crystalline interface layers may be grown over sacrificial layers when forming the stack of nanoribbons.

20 Claims, 9 Drawing Sheets

399

TRANSFER-FREE 2D FET AND FEFET DEVICE FABRICATION BY 2D MATERIAL GROWTH IN SUPERLATTICE WITH NITRIDES

BACKGROUND

Performance and cost pressures drive a continuous and ever-increasing demand for denser, cheaper, and faster integrated circuit devices. To maintain the pace of increasing transistor density, device dimensions must continue shrinking. However, the performance of silicon transistors drops significantly at the nanometer scale. New materials may enable continued increases in transistor densities, clock speeds, and price efficiencies.

Yet, with new materials come new difficulties. Improved structures and methods, along with new materials, are needed to support continued device miniaturization.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings.

DETAILED DESCRIPTION

Figure 1:
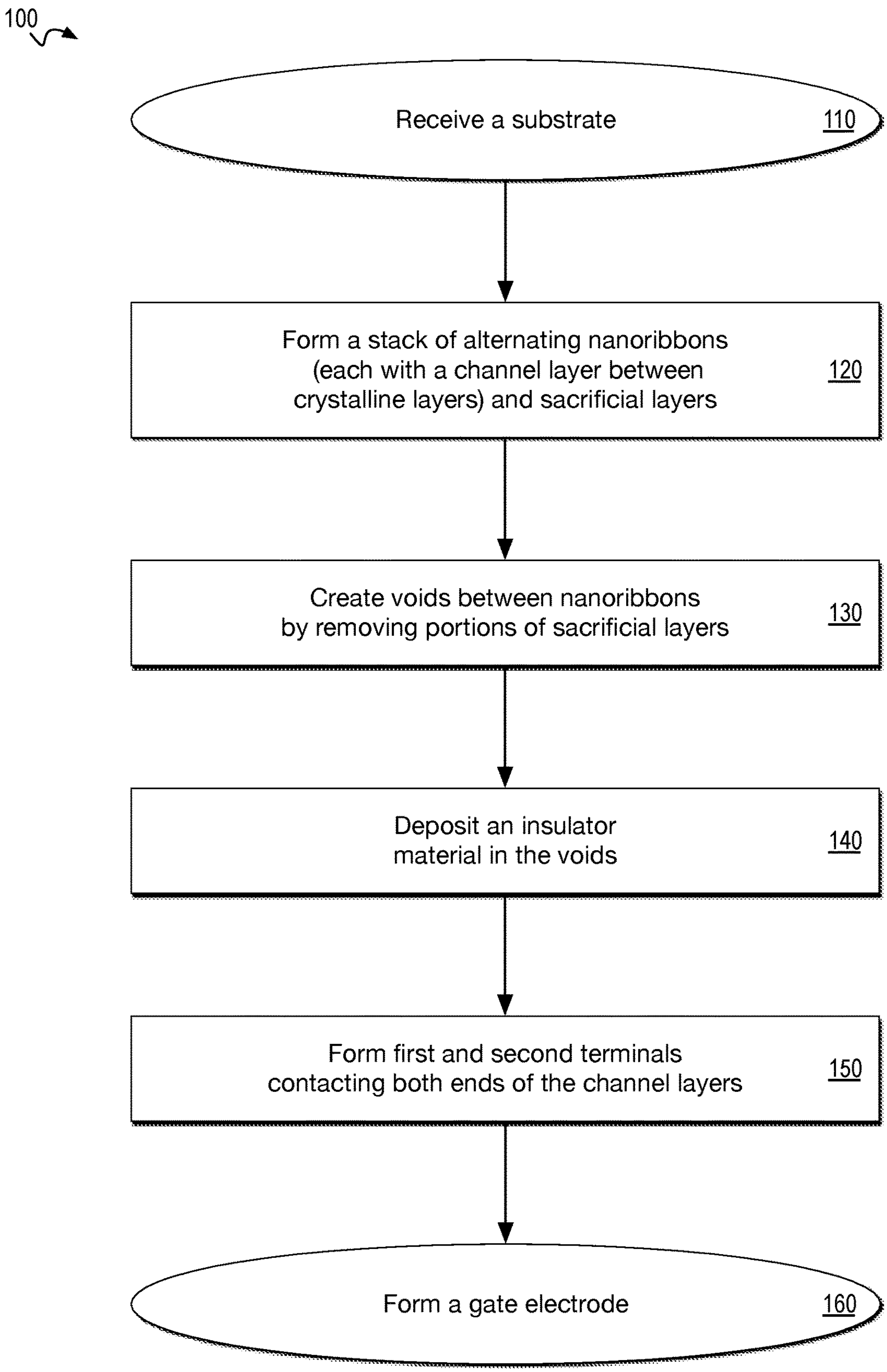
FIG. 1 illustrates various processes or methods for forming nanoribbons having two-dimensional (2D) materials, including for transistor channels and with a template for epitaxial growth.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed for forming transistors having channels with high-quality crystalline two-dimensional (2D) materials. Silicon field effect transistors (FETs) with miniaturized channels, e.g., nanoribbons in ribbon FETs, suffer from degraded performance as body thicknesses are reduced with decreasing channel length (e.g., <7 nm). However, some 2D materials have advantages as a replacement for silicon at the nanometer scale. Two-dimensional materials are crystalline solids with a thickness of sub-1 nm, only a single layer of atoms or molecules. Their monolayer properties may differ from their bulk properties in important ways. Some 2D materials are semiconducting and may have high charge-carrier mobilities, even with only monolayer channel thicknesses.

However, 2D device performance is degraded by poor quality of channel materials. Wafer-scale, crystal growth and transfer of 2D materials for use at the device-scale introduces challenges, such as potential contamination (e.g., by carbon from a source wafer) or structural nonuniformity problems induced by stresses, cracks, or other defects. A uniform, conformal, crystalline channel layer is desired for high performance 2D FET and FeFET. Polycrystalline 2D materials in transistor channels may result in degraded performance. Polycrystalline growth (e.g., of multiple, mismatched crystal lattices) must be prevented (or at least minimized). Single crystal growth of 2D nanoribbons may be enabled by a lattice-matched interface layer, which may enhance monocrystalline formation by acting as a growth template for epitaxial deposition over which a closely matched, 2D crystal lattice may be initiated. Ribbon FETs may be formed with multiple, monocrystalline channels of 2D materials.

In some embodiments, the 2D materials are transition metal dichalcogenides (TMD). TMD are compounds containing a transition metal and a chalcogen, and some TMD can be deposited as stable and semiconducting monolayers. In some embodiments, the transition metal is tungsten or molybdenum, and the chalcogen is sulfur or selenium (e.g., $MoS_2$ and $WS_2$). Thin, monocrystalline semiconductor channel layers with high carrier mobilities and on/off current ratios may be formed with these TMD on a suitable epitaxial growth template. A layer of such a growth template may be an interface between a TMD channel region and adjacent materials, e.g., a gate dielectric. In some embodiments, transistors have TMD channel layers between crystalline interface layers. In some such embodiments, a crystalline interface layer has a lattice constant substantially matched to a lattice constant of a crystalline TMD channel layer.

A nitride-based material system including aluminum nitride (AlN) may template epitaxial 2D growth thanks to a close lattice constant, allowing epitaxial registry with notable 2D materials, such as $MoS_2$ and $WS_2$. Other possible interface materials include nitrides of silicon, hafnium, or zirconium. This nitride-based material system may be grown epitaxially on convenient and well-characterized materials, such as silicon oxide (e.g., $SiO_2$). Besides as interfaces, nitride-based materials may be used for dielectrics and other insulators, as well as for conductors. Some nitride-based dielectric materials may also have ferroelectric properties (such as aluminum nitride doped with scandium, e.g., $Al_xSc_{1-x}N$) and be employed in ferroelectric FETs (FeFETs). In some embodiments, a crystalline interface layer includes aluminum scandium nitride (e.g., $Al_xSc_{1-x}N$).

FIG. 1 illustrates various processes or methods 100 for forming nanoribbons having 2D materials, including for transistor channels and with a template for epitaxial growth, in accordance with some embodiments. FIG. 1 shows methods 100 that includes operations 110-160. Some operations shown in FIG. 1 may overlap with other operations. FIG. 1 shows an example sequence, but the operations can be done in other sequences as well, and some operations may be omitted. Some operations can also be performed multiple times before other operations are performed. For example, multiple voids may be formed between nanoribbons, and at multiple points in processes or methods 100, before and after insulator materials are deposited in one or more voids. Optional operations will be described. Methods 100 generally entail forming a stack of alternating nanoribbons and sacrificial layers, the nanoribbons having interface layers over and under transistor channel layers of 2D materials, as well as forming other transistor structures (e.g., source and drain terminals and gate dielectrics and electrodes) adjacent the nanoribbons.

At operation 110, a substrate is received. The substrate may be an integrated circuit (IC) die or wafer, and may be of any suitable material or materials. The substrate may include a semiconductor or insulator material, including a crystalline material. In some examples, the substrate includes monocrystalline silicon (Si), germanium (Ge), silicon germanium (SiGe), a III-V alloy material (e.g., gallium arsenide (GaAs)), a silicon carbide (SiC), a sapphire ($Al_2O_3$), or any combination thereof. The substrate may also include other semiconductor materials, metals, dielectrics, dopants, and other materials commonly found in semiconductor substrates.

A stack of alternating nanoribbons and sacrificial layers is formed at operation 120. The stack may alternate one or more sacrificial layer(s) with one or more nanoribbon(s). The stack may be formed over structures formed over the substrate before the stack or as received on or in the substrate. For example, the stack may be formed over conductive structures or a conductive layer, e.g., that may be used as a back gate. A base layer may be formed over the substrate prior to forming the stack. Materials may be deposited, e.g., before or in the stack, by any suitable means, for example, by a chemical vapor deposition (CVD) and/or physical vapor deposition (PVD).

The one or more nanoribbons may have interface layers above and below a channel layer. A lower interface layer may be first deposited over the substrate using any suitable materials and means. Advantageously, the interface layer may be deposited with a crystalline structure over a variety of material surfaces and with a crystalline structure that closely matches the desired structure of the 2D material to be deposited. An interface layer having close lattice constant (e.g., the distance between atoms in crystal) can form epitaxial registry with a subsequent 2D channel material may enhance epitaxial growth of the 2D material and enable high quality (e.g., monocrystalline) channel layers. "Epitaxial" growth may refer to the formation of layers having crystalline structure in relationship with the grown lattice to the underlying material. In the case of a crystalline layer grown on a lattice-matched growth template, the grown lattice may have a well-defined epitaxial relationship. In the case of, for example, a crystalline interface layer grown on, e.g., a sacrificial layer, one or more interlayer relationships may not be so well defined. A growth template with a lattice matched to the desired crystalline structure to be deposited may ensure that the resulting film is monocrystalline, or at least substantially monocrystalline. For example, a monocrystalline channel layer has a uniform crystal lattice structure for the entirety of the channel region (e.g., from source terminal to drain terminal). A polycrystalline channel layer may have many crystal lattices, e.g., with discontinuities at grain boundaries between lattices, over the span of a channel region. A substantially monocrystalline channel layer may have a mostly uniform crystal lattice, but with a single grain boundary between source and drain terminals. While crystalline growth may include monocrystalline and polycrystalline structures, lattice discontinuities and grain boundaries interfere with charge-carrier flow, and so monocrystalline channel layers are preferable to polycrystalline channel layers.

In addition to superior epitaxial growth templating properties of nitrides for 2D materials, lattice matching interface and channel layers may reduce stresses on (and induced damage of) interface and channel layers. When epitaxially growing a crystalline film on a crystalline substrate of a different material, the grown film may experience a strain dependent on a lattice mismatch between lattice constants of the crystalline base substrate and crystalline grown film. Such strains may be exacerbated when differing materials have differing thermal expansion coefficients and undergo thermal transients. Interface and channel layers may beneficially be deposited one over the other at low temperatures. Reducing stressing of and damage to channel layers may result in superior (e.g., more uniform and monocrystalline) channel regions.

The interface layer may be an insulator, for example, that may entirely cover a channel layer between source and drain terminals, and advantageously be a high-k (high-permittivity) dielectric, e.g., relative to silicon dioxide. Such a dielectric material may also function as a gate dielectric and assist in satisfactorily controlling channel conduction while limiting gate leakage currents. Such a dielectric material may allow for thicker deposition (e.g., of more layers in the interface lattice), for example, to limit gate leakage, but a thinner layer may be deposited as well (e.g., when using an additional material for a gate dielectric). In some embodiments, an interface layer is deposited, e.g., epitaxially grown, with a thickness of less than 1 nm. In some such embodiments, an additional gate dielectric layer may also be deposited. In some embodiments, an interface layer is deposited, e.g., epitaxially grown, with a thickness of 5 nm. In some such embodiments, the interface layer may serve as a gate dielectric. Arbitrarily thick interface layers may be deposited, as desired.

In some embodiments, interface layers may be formed with a same composition and crystal structure above and below a channel layer. Advantageously, in addition to acting as a growth template for a 2D channel material to be grown on, the interface layer may be conveniently deposited over a 2D channel material as an interface layer for subsequent deposition of, e.g., a sacrificial layer (in building up the stack) or a dielectric layer (after removing a sacrificial layer). Similarly, as described above, a high-k interface layer over a channel layer may act as a gate dielectric between the channel layer and a gate electrode above the channel layer.

In some embodiments, an interface layer includes AlN. Aluminum nitride may be grown epitaxially with multiple known methods. For example, AlN may be grown by molecular-beam epitaxy (MBE) or metal organic CVD (MOCVD) on various substrates. In this way, AlN may be deposited over the received substrate (and later deposited sacrificial layers) and serve as a growth template for epitaxial deposition of similar lattices of 2D channel materials. Aluminum nitride may make an excellent growth template for some 2D materials, as AlN has a close epitaxial registry with some notable TMD. For example, hexagonal wurtzite AlN (with a lattice constant of 3.13 Å) has a crystal structure matching that of TMD, such as $MoS_2$. $WS_2$, $MoSe_2$, and $WSe_2$, and with in-plane lattice constant mismatches of less than 2% with $MoS_2$ and $WS_2$ (both with lattice constants ~3.19 Å) and of about 6% with $MoSe_2$ and $WSe_2$ (both with lattice constants <3.3 Å).

Aluminum nitride is additionally advantageous in that it is compatible (as an upper or lower interface layer material) with the growth of a nitride-based materials stack having the necessary conductors, dielectrics, and other insulators. The advantageous growth of a multiple layers consecutively in a single chamber (e.g., without breaking vacuum or unnecessarily exposing substrates and grown layers to contaminants) is enabled by a nitride-based materials system. For example, silicon nitride (e.g., $Si_3N_4$), hafnium nitride (e.g., HfN), and zirconium nitride (e.g., ZrN) are also available as an insulator in an interface layer adjoining a 2D channel layer. Notable oxides, such as of silicon, aluminum, and hafnium (e.g., $SiO_2$, $Al_2O_3$, $HfO_2$), are also enabled, as they can grow from and bond with or on some nitrides (e.g., AlN), for example, in ways they cannot on 2D TMDs (e.g., more uniformly on AlN). For example, hafnium oxide may grow uniformly on AlN but exhibit non-uniformities over a channel layer, e.g., of TMD (without a nitride interface layer).

Besides acting as a growth template (e.g., lower interface layer) for under a 2D channel layer, AlN is well suited as an upper interface layer over some 2D materials, such as notable TMD. Aluminum nitride may be deposited on TMD at low temperatures (e.g., <250° C.) with a plasma-assisted atomic layer deposition (ALD). Similarly, TMD monolayers may be grown in this material system, over AlN, even at low temperatures. This may be especially advantageous for back end of line transistor device fabrications.

A channel layer of the nanoribbon may be deposited over an interface layer using any suitable materials and means. In some embodiments, a channel layer is formed by depositing a 2D material, e.g., over an interface layer. In some embodiments, a channel layer is epitaxially grown, for example, over a crystalline interface layer. In some embodiments, the channel layer has a lattice constant approximately matched to a lattice constant of a crystalline interface layer. Channel and interface layers have approximately matched lattice constants when the difference of the lesser and greater lattice constants is less than 10% of the greater lattice constant. In some embodiments, the channel layer has a lattice constant substantially matched to a lattice constant of a crystalline interface layer. Channel and interface layers have substantially matched lattice constants when the difference of the lesser and greater lattice constants is less than 4% of the greater lattice constant. In some embodiments, a channel layer has a thickness of a monolayer (e.g., of a single molecule). In some such embodiments, the channel layer has a thickness of less than 1 nm. Examples of suitable 2D materials for the nanoribbon channel layer may include, but are not limited to, the graphene family (e.g., graphene, hexagonal boron nitride, boron carbonitride (BCN), fluorographene, graphene oxide, etc.), 2D chalcogenides (e.g., $MoS_2$, $WS_2$, $MoSe_2$, $WSe_2$, semiconducting dichalcogenides, metal dichalcogenides, layered semiconductors, etc.), 2D oxides (micas, bismuth strontium calcium copper oxide (BSCCO), $MoO_3$, $WO_3$, layered Cu oxides, $TiO_2$, $MnO_2$, $V_2O_5$, $TaO_3$, $RuO_2$, perovskite-type, hydroxides, etc.). The 2D materials may be monolayer or multi-layers.

In some embodiments, a channel layer is of a TMD material. The TMD may include a metal and a chalcogen, e.g., a non-oxygen element in Group 16, such as sulfur, selenium, or tellurium. In some embodiments, the TMD material includes tungsten and either sulfur or selenium (e.g., $WS_2$ or $WSe_2$). In some embodiments, the TMD material includes molybdenum and either sulfur or selenium (e.g., $MoS_2$ or $MoSe_2$). Semiconducting monolayers of $WS_2$. $WSe_2$. $MoS_2$, or $MoSe_2$ may be more stable, for example, in room temperature, non-inert environments, and may be more conveniently deposited than those of other 2D materials. Additionally, as previously described, $MoS_2$ and $WS_2$ both have lattice constants substantially matched to AlN. As previously described, $MoSe_2$ and $WSe_2$ both have lattice constants approximately matched to AlN. In some embodiments, these TMD (or other 2D materials) are epitaxially grown over AlN (or other suitable growth template) in monocrystalline channel layers. These TMD may have high carrier mobilities and on/off current ratios, even with a thickness of a molecular monolayer. In some embodiments, a channel layer is epitaxially grown with a thickness of less than 1 nm.

As previously described, these TMD are compatible as a channel layer in a stack with AlN as an upper and/or lower interface layer. Aluminum nitride may be epitaxially grown on TMD at low temperatures (e.g., with a plasma-assisted ALD), and TMD monolayers may be epitaxially grown to AlN at low temperatures.

An upper interface layer may or may not be deposited, e.g., epitaxially grown, in a similar manner to a lower interface layer. For example, an upper interface layer may be grown differently because of growing over a different material layer (e.g., AlN deposited by a plasma-assisted ALD over TMD and AlN deposited by an MOCVD over a sacrificial layer). Upper interface layers may be deposited differently than a lower interface layer to serve different and/or additional functions than an upper interface layer. Upper and lower interface layers may be deposited substantially similarly while having different compositions or structures. In some embodiments, an interface layer of AlN doped with scandium is deposited by plasma-assisted ALD over a TMD channel layer. In some embodiments, an interface layer of AlN doped with scandium is deposited by MOCVD over a sacrificial (e.g., oxide) layer. Aluminum scandium nitride (e.g., $Al_xSc_{1-x}N$) may have a crystalline structure similar to AlN but, besides being a high-k dielectric, may also have ferroelectric characteristics and be employed in FeFETs or other ferroelectric devices using this same nitride-based materials stack and manufacturing scheme. As described above, an AlN layer may be grown to a thickness suited to a particular embodiment, and this scalability is further advantageous in FeFET embodiments.

A sacrificial layer may be deposited over an interface layer using any suitable materials and means, for example, by a CVD. The sacrificial material may be chosen to have an etch selectivity between the sacrificial layer and an interface layer, various alternatives of which are available for both. In some embodiments, a sacrificial layer is grown and includes an oxide, such as of silicon or aluminum (e.g., $SiO_2$ or $Al_2O_3$). In some embodiments, a sacrificial layer is grown and includes a nitride, such as of silicon (e.g., $Si_3N_4$). A thickness of the sacrificial layer may be greater than that of the nanoribbon. For example, some or all of the sacrificial layer(s) may be removed and the resultant void between nanoribbons filled with a gate structure, including dielectric layers and a gate electrode.

More nanoribbons (including interface and channel layers) and sacrificial layers may be formed, as desired, to complete the stack and operation 120 of processes or methods 100. The stack may begin or end with whichever layer is suitable to an embodiment. For example, some alternating stacks start and end with interface layers. In some embodiments, sacrificial layers start and end the stack of layers, e.g., to be replaced by gate structures.

Figure 2A:
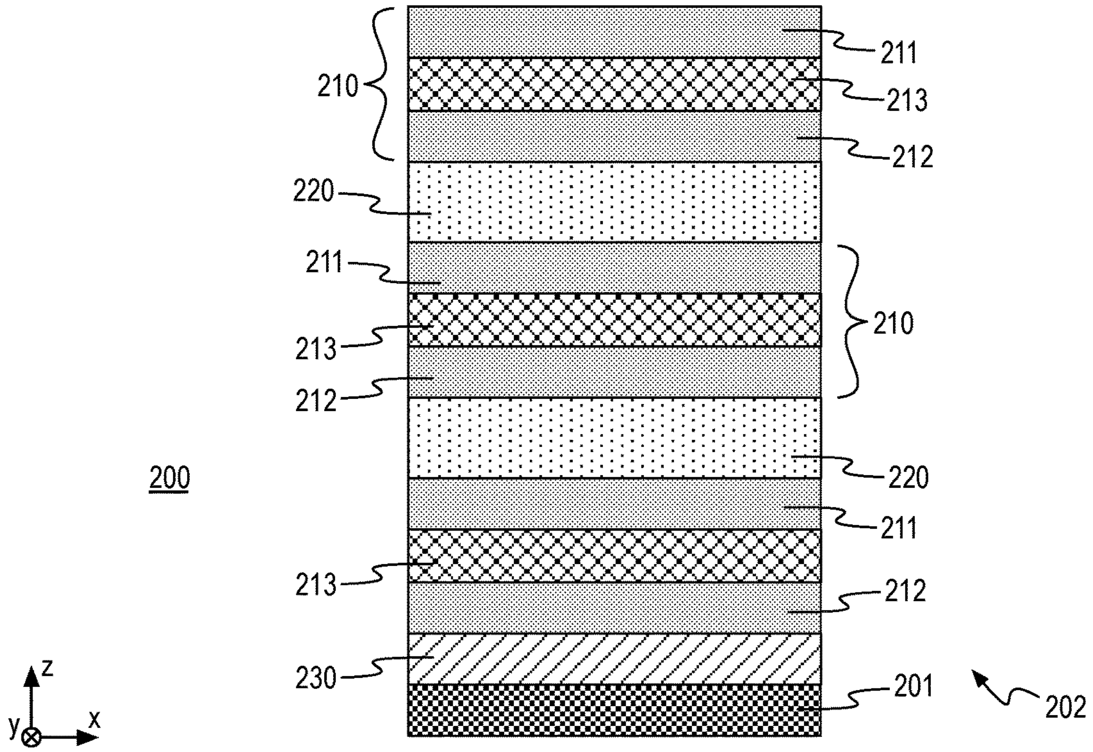
FIGS. 2A and 2B illustrate cross-sectional profile views of exemplary stacks of alternating sacrificial layers and 2D material-based nanoribbons, including nitride interface layers.
Figure 2B:
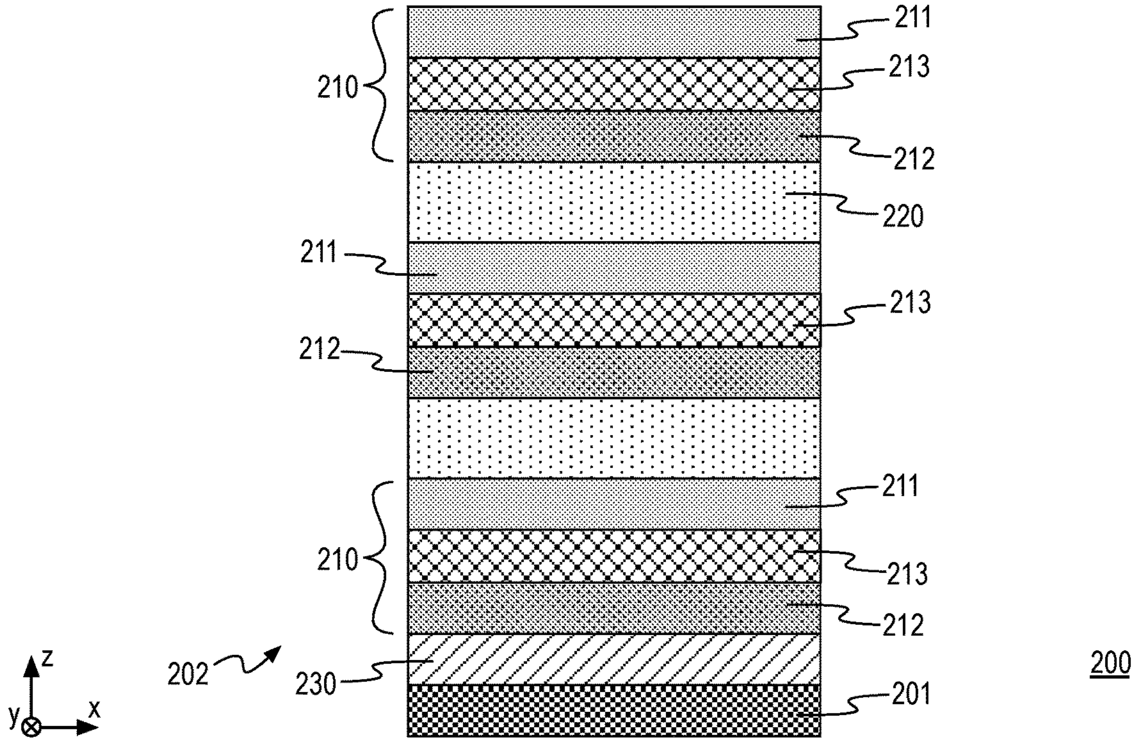

FIGS. 2A and 2B illustrate cross-sectional profile views of exemplary stacks 202 of alternating sacrificial layers 220 and 2D material-based nanoribbons 210, including nitride interface layers, in accordance with some embodiments. FIG. 2A shows stack 202 over a substrate 201 in an IC die 200, for example, as the formation of which was described at operation 120 of processes or methods 100. Stack 202 includes a plurality of nanoribbons 210 separated by a plurality of sacrificial layers 220. In some embodiments, stack 202 includes a single nanoribbon 210 above or below at least one sacrificial layer 220. Each nanoribbon 210 includes upper and lower interface layers 211, 212 above and below channel layer 213. In the example of FIG. 2A, stack 202 is over a conductive layer 230, which is over (or the uppermost layer of) substrate 201.

As described at operation 110 of processes or methods 100, substrate 201 may include any of various materials. In the example of FIG. 2A, substrate 201 is predominantly monocrystalline silicon.

Stack 202 is over conductive layer 230, which may serve as, e.g., a back gate. Advantageously, conductive layer 230 is compatible with a nitride-based materials system. Conductive layer 230 may include a conductive ceramic material, which may be robust conductors and capable of withstanding very high temperatures. In some embodiments, conductive layer 230 is predominantly titanium nitride (e.g., TiN). In other embodiments, conductive layer 230 is predominantly niobium nitride (e.g., NbN). Conductive layer 230 may be of other materials, such as a tantalum nitride, molybdenum nitride, ruthenium nitride, etc., including non-nitride materials.

Channel layer 213 may be a crystalline semiconductor material. In some embodiments, channel layer 213 is a 2D material with a uniform monocrystalline structure throughout the entirety of layer 213. In some embodiments, channel layer 213 is a TMD and includes a metal and a chalcogen. In some such embodiments, the metal is tungsten or molybdenum, and the chalcogen is sulfur or selenium. Channel layer 213 may have advantages as described at least at operation 120 of processes or methods 100. For example, channel layer 213 may be a monocrystalline TMD monolayer with a thickness of less than 1 nm. In the example of FIG. 2A, channel layer 213 is a monocrystalline TMD monolayer of tungsten and sulfur (e.g., $WS_2$) with a lattice constant of less than 3.2 Å.

Interface layers 211, 212 are crystalline layers over and under channel layers 213. In the example of FIG. 2A, both layers 211, 212 are of AlN (and both are hexagonal AlN with a wurtzite structure and tetrahedral bonding). With channel layer 213 being of tungsten and sulfur (e.g., $WS_2$) with a lattice constant of less than 3.2 Å, channel layer 213 has a lattice constant substantially matched to a lattice constant of interface layers 211, 212 (with a lattice mismatch of less than 2%). In other embodiments, layers 211, 212 are of AlN, and channel layer 213 (of $WSe_2$ and with a lattice constant of less than 3.3 Å) has a lattice constant approximately matched to a lattice constant of interface layers 211, 212 (with a lattice mismatch of about 6%). Other lattice-matched combinations of channel layers 213 and interface layers 211, 212 are available. As described at operation 120 of processes or methods 100, interface layers 211, 212 lattice-matched to channel layers 213 may have multiple benefits, including as a growth template for monocrystalline channel layers 213.

In addition to the advantages described at least at operation 120 of processes or methods 100 (e.g., lattice-matching with some channel materials, compatibility with a nitride-based materials system), interface layers 211, 212 of AlN may have other benefits. Aluminum nitride has a very high thermal conductivity, particularly for an electrical insulator, and its local heat dissipation may play a valuable part in thermal management schemes, e.g., from channel layers 213 out to metallization structures. Aluminum nitride is a high-bandgap insulator and so may provide an effective isolation between adjacent conductive structures. As a dielectric, in addition to high permittivity, AlN has a high dielectric breakdown, e.g., when voltage differences.

Sacrificial layers 220 between nanoribbons 210 may be of any suitable material(s), e.g., with an etch selectivity between 220 and 210 (e.g., interface layers 211, 212). In some embodiments, sacrificial layers 220 are of a nitride (e.g., of silicon, such as $Si_3N_4$). Nitride-based materials may have the benefits described at least at operation 120 of processes or methods 100 (e.g., growing multiple layers consecutively in a single chamber), but other materials may also be conveniently formed. In some embodiments, sacrificial layers 220 are of an oxide, for example, of silicon or aluminum (e.g., $SiO_2$ or $Al_2O_3$), which may be formed uniformly on interface layers 211, 212, e.g., of AlN.

FIG. 2B shows stack 202, similar to the example of FIG. 2A, for example, as described at operation 120 of processes or methods 100. In the example of FIG. 2B, interface layers 211, 212 include AlN, but interface layers 212 include aluminum scandium nitride, for example, AlN doped with scandium (e.g., $Al_xSc_{1-x}N$). Interface layers 211, 212 may have a same or similar crystalline structure, for example, substantially or at least approximately matched to channel layers 213, but some aluminum sites in the AlN lattice of interface layers 212 are replaced with scandium atoms. Stack 202 (due to $Al_xSc_{1-x}N$ in interface layers 212) may have ferroelectric characteristics suited for employment in FeFETs.

In some embodiments, 212 has a composition and structure different than that of FIG. 2B (e.g., $Al_xSc_{1-x}N$) and 211. In some embodiments, both interface layers 211, 212 have the scandium-doped aluminum nitride composition. In some embodiments, 212 is entirely AlN, and 211 is scandium-doped aluminum nitride.

Figure 3A:
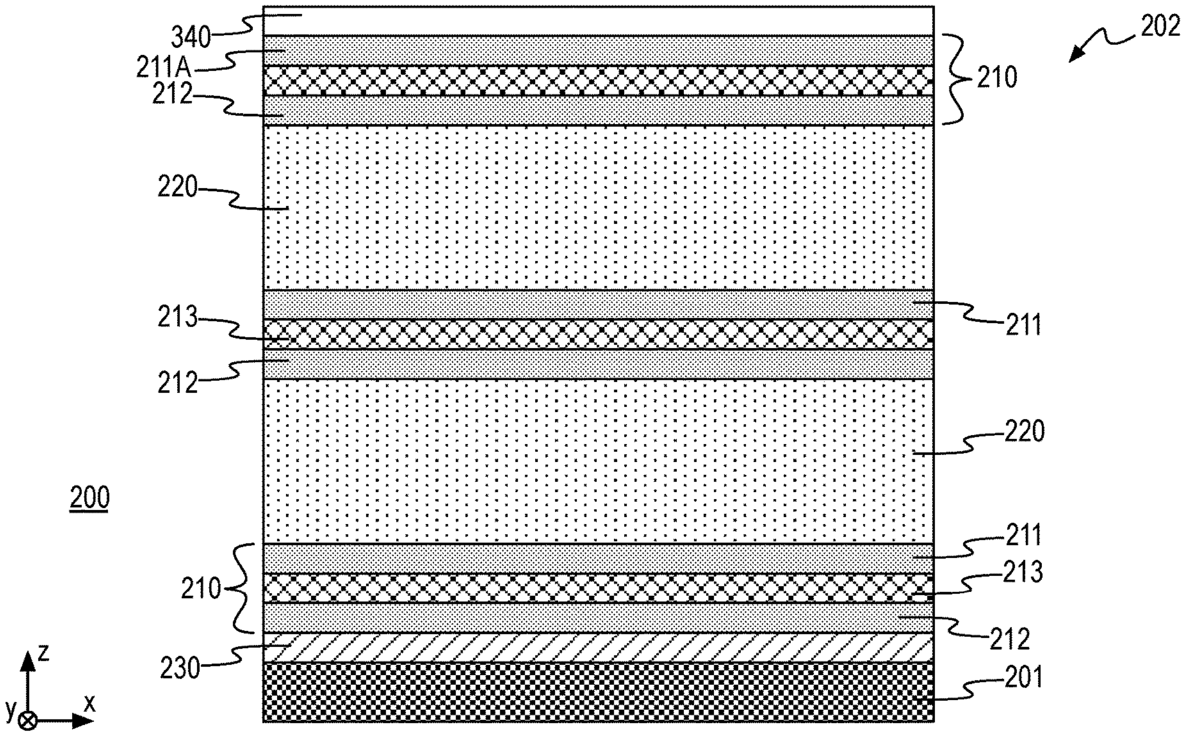
FIGS. 3A, 3B, 3C, 3D, 3E, 3F, 3G, and 3H illustrate cross-sectional profile views of an integrated circuit (IC) die and transistor structure, including nanoribbons with 2D material channel and interface layers between source and drain terminals, at various stages of manufacture.

FIGS. 3A, 3B, 3C, 3D, 3E, 3F, 3G, and 3H illustrate cross-sectional profile views of an IC die 200 and transistor structure 302, including nanoribbons 210 with 2D material channel layers 213 and interface layers 211, 212 between source and drain terminals 351, 352, at various stages of manufacture, in accordance with some embodiments. FIG. 3A shows stack 202 of alternating nanoribbons 210 and sacrificial layers 220 over substrate 201 in IC die 200, much as described in FIGS. 2A and 2B. Additionally, a hard mask 340 is over an uppermost interface layer 211A. Mask 340 may be any suitable material, such as a nitride or carbide, etc., for example, that may be compatible with a photolithography process. Mask 340 may be patterned by some operations and protect or mask lower layers (e.g., device channel regions) at some operations, for example, during anisotropic etches.

Figure 3B:
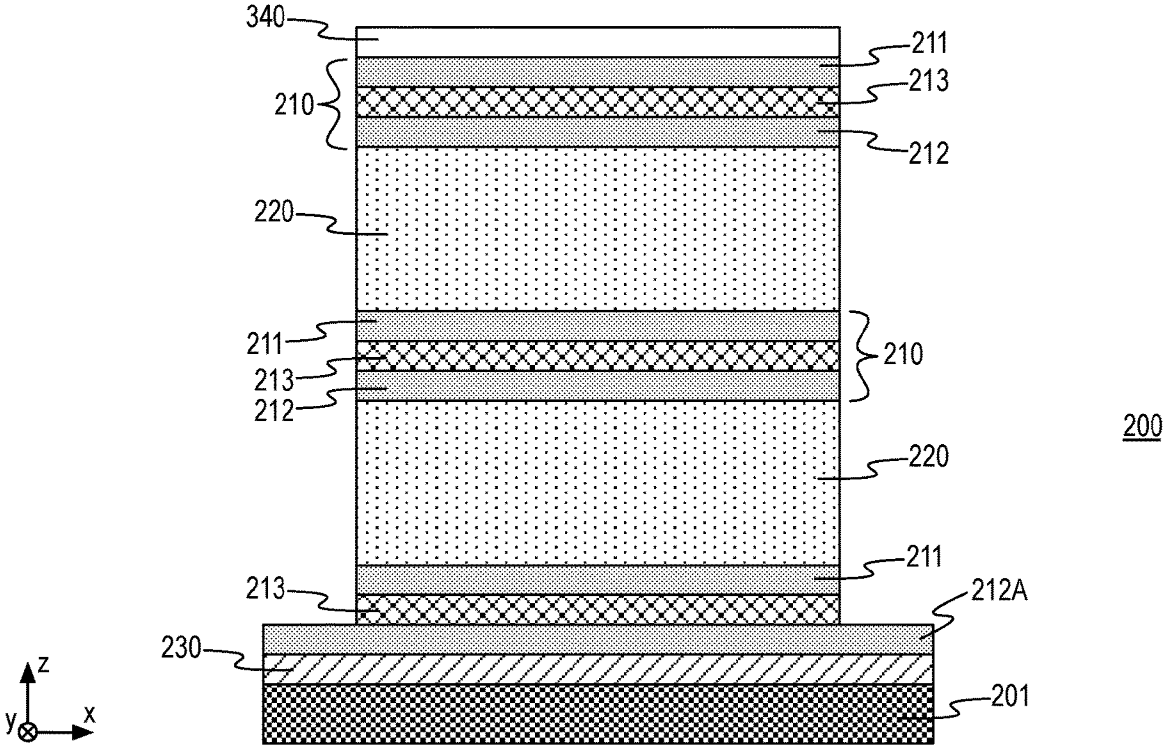

FIG. 3B illustrates alternating nanoribbons 210 and sacrificial layers 220 over substrate 201, e.g., after sacrificial layers 220 and channel layers 213 and some of interface layers 211, 212 have been optionally patterned. Portions of some layers are absent, for example, having been removed by an isotropic etch, including mask 340. Some layers below also have portions absent, matching the stencil of mask 340. The entirety of lowermost interface layer 212A is retained over conductive layer 230 and substrate 201, for example, to serve as electrical isolation between conductive layer 230 and subsequently formed structures, e.g., source and drain terminals on either side of channel layers 213. In some embodiments, nanoribbons 210 and sacrificial layers 220 are formed at the desired locations and with the desired dimensions.

Some dimensions, for example, a length and width (e.g., in the x and y directions, respectively), of nanoribbons 210 may be adjusted to suit an embodiment. For example, while nanoribbons 210 with smaller dimensions may be desirable, e.g., to improve device density, some dimensions may be kept above certain thresholds to ensure satisfactory operation, e.g., at high frequencies and of sufficient conduction. Nanoribbons 210 may be grown with a greater width or patterned to a lesser width to increase or decrease a channel region's conducting cross-sectional area and so to get a desired aggregate channel width for the transistor. A nanoribbon may have a great enough width to be a nanosheet, or a lesser width and may be a nanowire. A nanoribbon length may be adjusted, e.g., patterned, with nanoribbon width, e.g., to avoid short-channel effects.

Returning to FIG. 1, at operation 130, voids are created between nanoribbons by removing at least a portion of one or more of the sacrificial layers. Various gate structures may be formed later in the void(s), so opening void(s) adjacent the channel layers may be by various suitable means. In some embodiments, one or more of the sacrificial layer(s), or portions of them, may be removed, for example, by selectively etching the sacrificial layer(s). For example, an isotropic etch selective to a sacrificial oxide (e.g., of silicon or aluminum) or other material may remove outer (side) portions of the stack and may retain inner (central) portions. In some embodiments, one or more entire sacrificial layers may be removed. Sidewalls (or other conformal masking materials) may be added and subsequently removed, e.g., from one or more sides or the front or back, to cover or expose various surfaces of the stack.

Figure 3C:
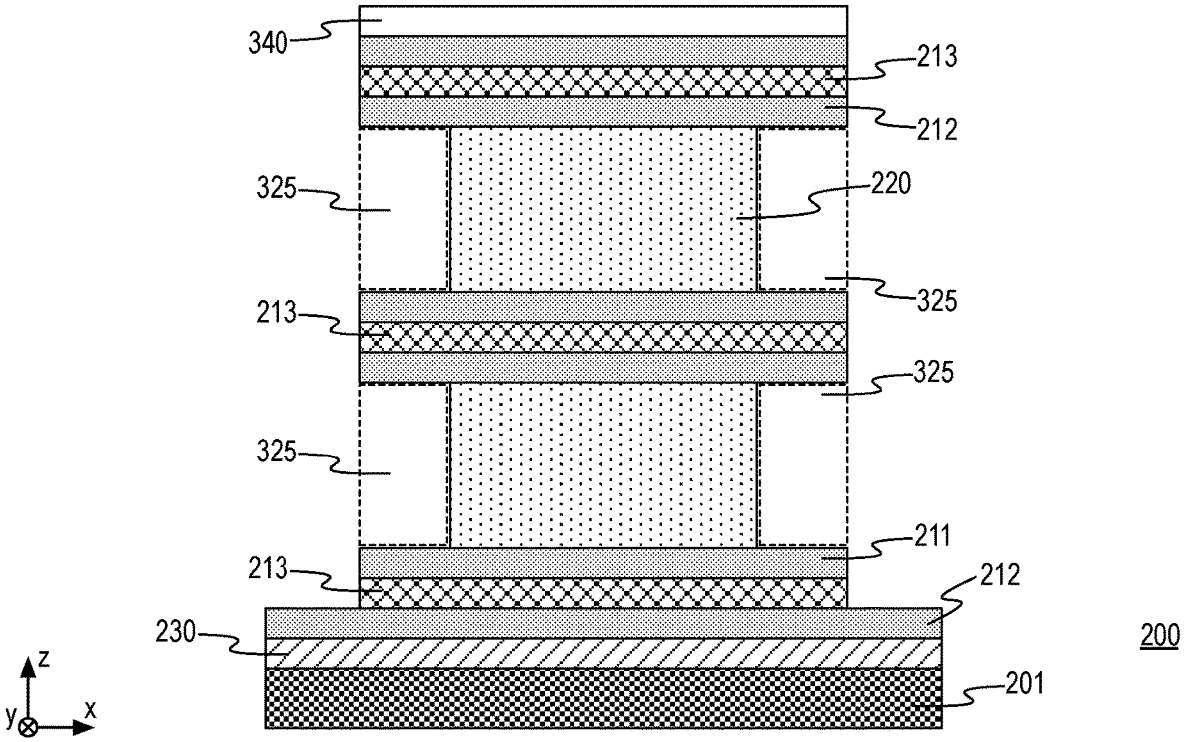

FIG. 3C shows side voids 325 in sacrificial layers 220, for example, after an etch of IC die 200 selective to sacrificial layers 220. Those side portions of sacrificial layers 220 that had been exposed are absent. Central portions of sacrificial layers 220 remain.

Returning to processes or methods 100 in FIG. 1, an insulator is deposited in the void(s) at operation 140. For example, a low-permittivity dielectric may be grown in the void(s), e.g., to insulate a subsequent gate structure from source and drain terminals. This side insulator may provide physical support when the central, remaining portions of sacrificial layers are removed. As such, this side insulator may be a different oxide or nitride, etc., from the sacrificial layers and have an etch selectivity with the sacrificial layers. The insulator may be formed by any suitable means. For example, an insulator may be conformally deposited in the void(s).

Figure 3D:
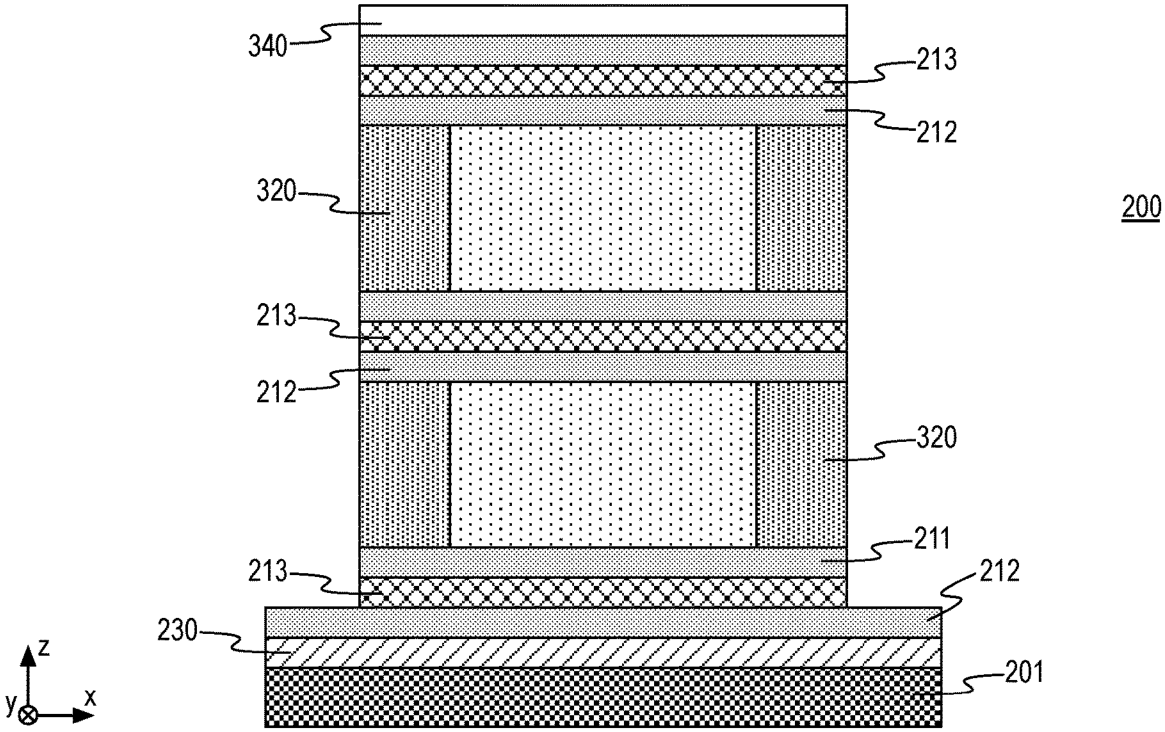

FIG. 3D illustrates IC die 200 with insulators 320, for example, after a deposition operation 140 of processes or methods 100. Insulators 320 may be of a low-k material, and there may be an etch selectivity between sacrificial layers 220, which may subsequently be removed, and insulators 320.

Returning to FIG. 1, at operation 150, one or more terminals are formed contacting the channel layers, e.g., by a metal deposition introducing sidewalls to directly contact a 2D material channel layer. For example, a source terminal may be deposited contacting a left end of one or more channel layer(s) and a drain terminal may be deposited contacting a right end of one or more channel layer(s). Although structures may be referred to as a source or drain in some examples, these labels are not restrictive and may be reversed in this and other embodiments. Any suitable means may be employed to deposit the terminals. For example, a metal (or other conductive material) may be built up or filled in, or otherwise deposited, adjacent the stack to contact the channel layers.

Figure 3E:
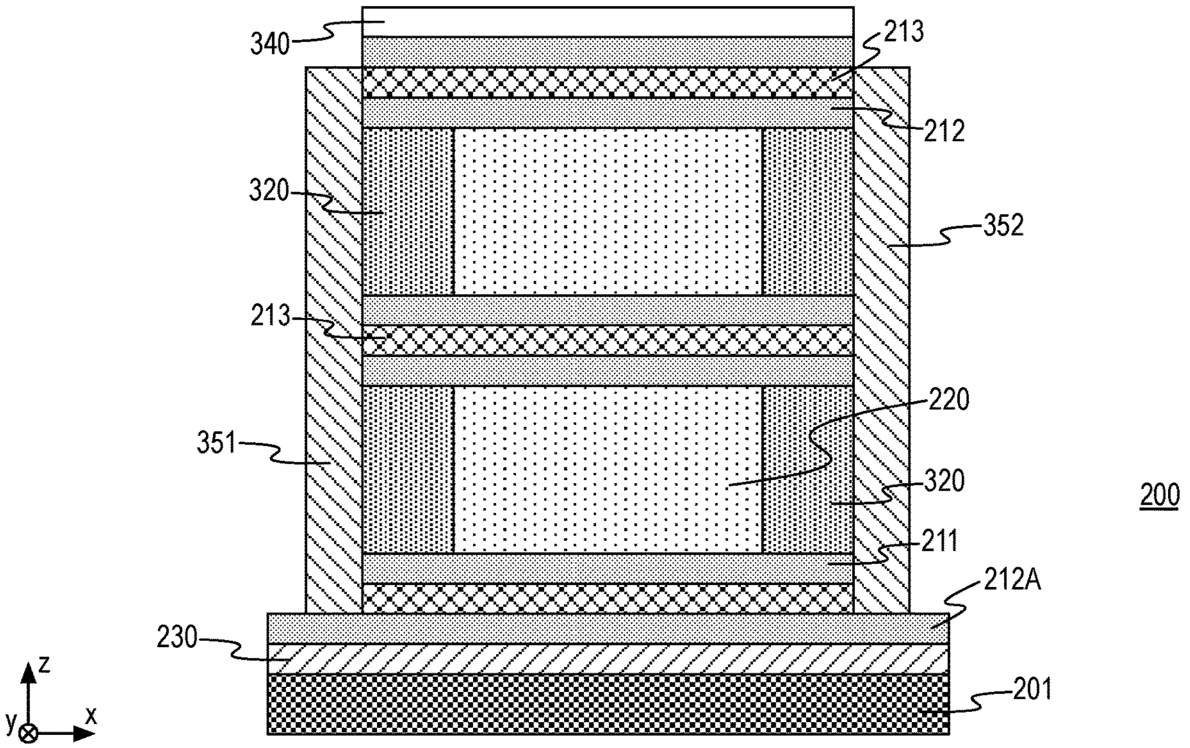

FIG. 3E shows IC die 200 with source terminal 351 and drain terminal 352 directly contacting corresponding ends of channel layers 213. Interface layer 212A serves as insulation between source and drain terminals 351, 352 and conductive layer 230. Insulators 320 may serve as insulation between source and drain terminals 351, 352 and subsequently formed gate structures, e.g., between terminals 351, 352 and between nanoribbons 210.

Returning to processes or methods 100 in FIG. 1, operation 130 may again be performed to open one or more central voids in the stack. For example, an interlayer etch between nanoribbons may remove the material remaining of the sacrificial layers in preparation for forming a gate structure. An etch of the sacrificial, e.g., oxide may use established processes, as before, for example, a wet etch using HF vapor or a dry, plasma etch. The central sacrificial portions may be exposed by, e.g., removing sidewalls or other masking materials in front or behind the stack.

Figure 3F:
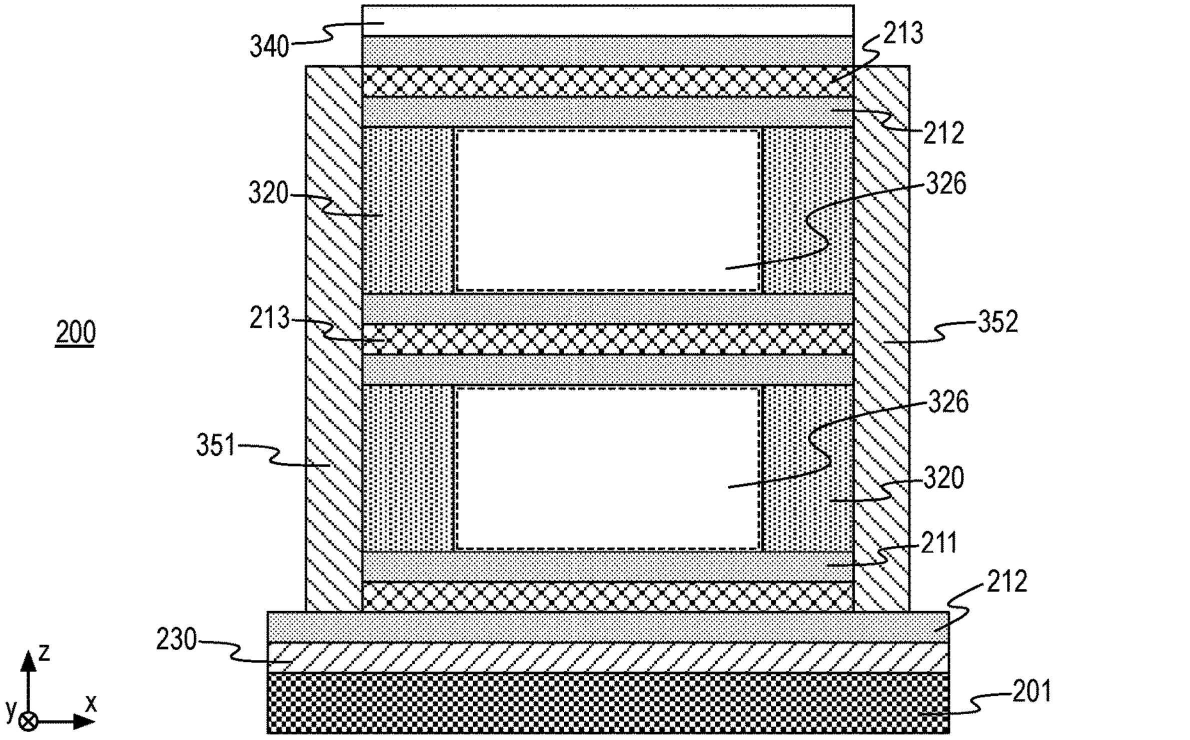

FIG. 3F illustrates IC die 200 with central voids 326 vertically between nanoribbons 210 and laterally between insulators 320. Central voids 326 are adjacent nanoribbons 210 and their channel layers 213. The embodiment of FIG. 3F may be formed as described. In some embodiments, sacrificial layers 220 are removed in a single etch, and insulators 320 are formed after source and drain terminals 351, 352 on sidewalls of terminals 351, 352. In some such embodiments, nanoribbons 210 are physically supported by structures, e.g., sidewalls, in front and behind the viewing plane.

Returning to FIG. 1, operation 140 may be performed again to deposit an insulator in the central voids. A conformal deposition may form a gate dielectric on all surfaces of the voids, including on the interface layers and adjacent the channel layers. For example, a layer of high-k dielectric (such as a hafnium oxide, e.g., $HfO_2$) of desired thickness may be deposited with an ALD. Other materials or means may be used. The deposition, e.g., of an oxide, such as $HfO_2$, may benefit from the deployment of the interface layers, as these materials may not deposit as well (e.g., as uniformly) on a channel layer of, for example, a 2D material, such as a TMD.

In some embodiments, a layer of ferroelectric material (e.g., hafnium zirconium oxide ($H_2O$) or lanthanum doped $H_2O$) may be deposited. In some such embodiments, the interface layer is a ferroelectric material, such as aluminum scandium nitride.

Figure 3G:
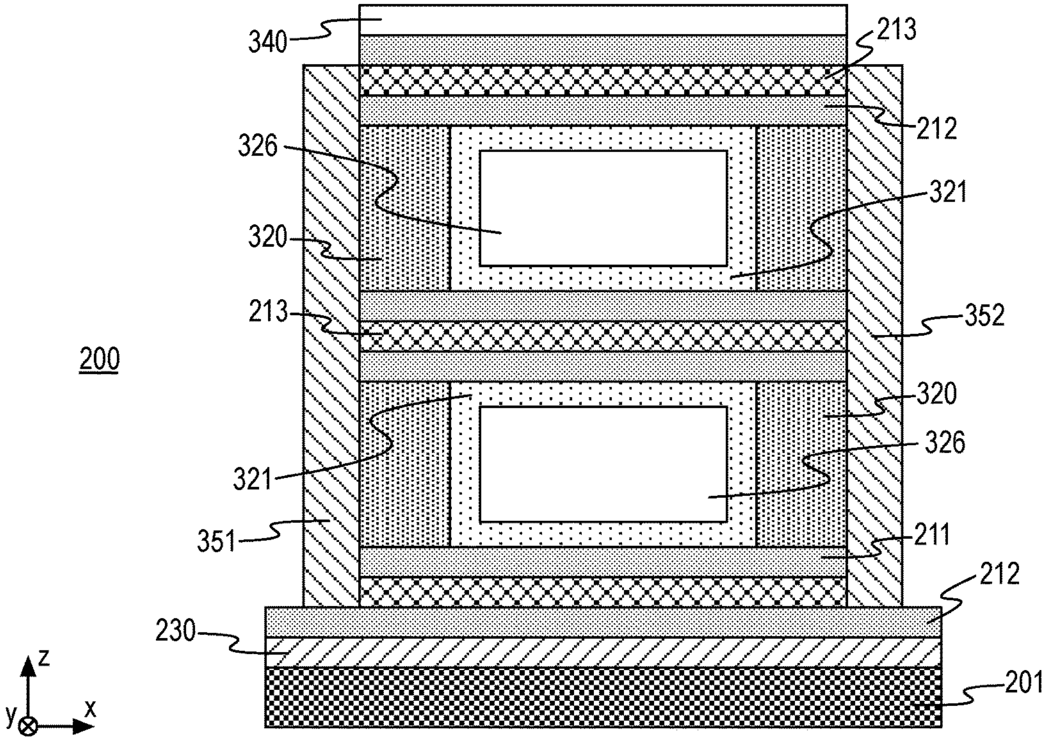

FIG. 3G shows IC die 200 with central voids 326, but with gate dielectric 321 conformally on the surfaces of central voids 326. Gate dielectric 321 is adjacent channel layers 213 and on layers 211, 212. Gate dielectric 321 may work with interface layers 211, 212, which may all be of high-k dielectric materials.

Returning to processes or methods 100 in FIG. 1, a gate electrode may be formed by depositing an electrode material in a void between nanoribbons at operation 160. A conformal deposition of a conductive material over all surfaces of the void(s) may form a gate electrode in the void(s) and adjacent the channel layers. For example, a gate electrode may be formed with an ALD of a conductive material, such as a metal or ceramic, e.g., a titanium nitride (TiN). Other conductive metals, including nitrides described above, may be deposited. These or other materials may also be deposited over the stack as a top gate electrode.

Figure 3H:
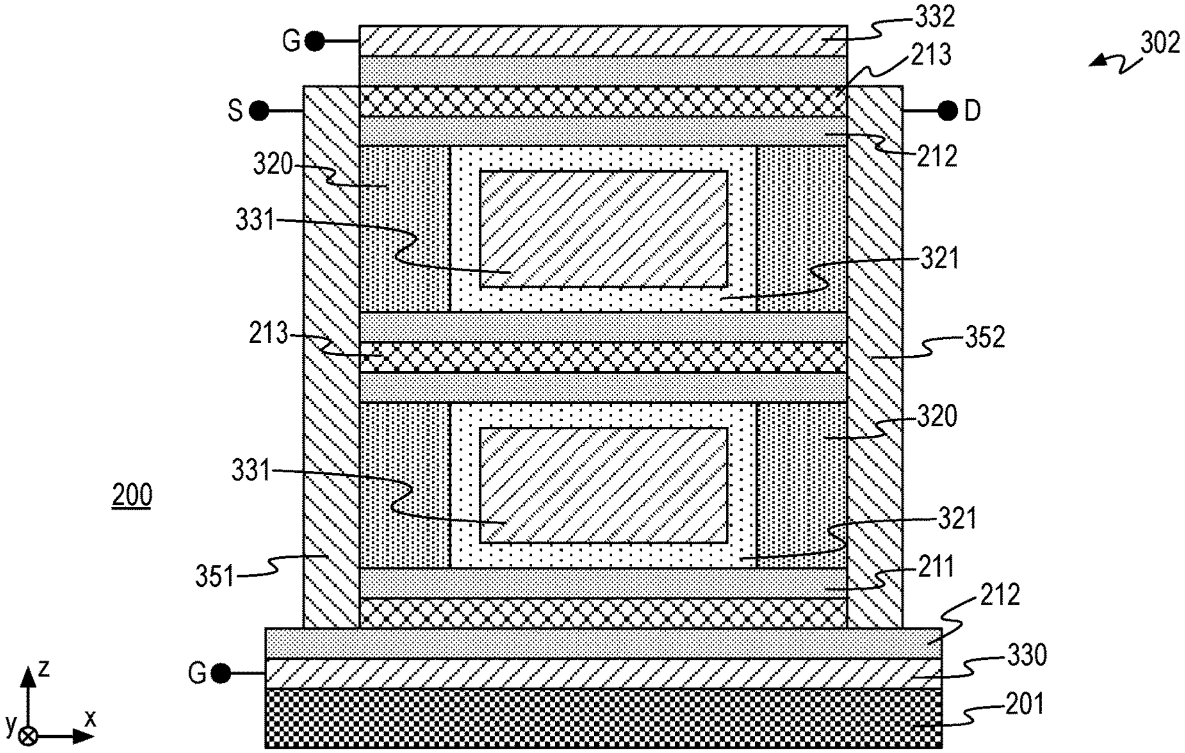

FIG. 3H shows transistor structure 302 on IC die 200, e.g., after an operation 160, including with top gate electrode 332 over, back gate electrode 330 under, and the gate electrodes 331 between channel layers 213. Gate electrodes 330, 331, 332 may be coupled, e.g., electrically connected, in front and behind the viewing plane. Transistor structure 302 includes source and drain terminals 351, 352, multiple nanoribbons 210 between and coupled to source and drain terminals 351, 352. Each of nanoribbons 210 includes crystalline interface layers 211, 212 and channel layer 213 between layers 211, 212. IC die 200 is coupled (and electrically connected) to host component 399.

In the example of FIG. 3H, channel layer 213 is a monocrystalline TMD monolayer of and includes tungsten as a transition metal and sulfur as a chalcogen (e.g., tungsten disulfide, $WS_2$). In some embodiments, channel layer 213 is a monocrystalline monolayer of molybdenum disulfide (e.g., $WS_2$). In some embodiments, channel layer 213 is a monocrystalline monolayer of selenium and either tungsten or molybdenum disulfide (e.g., $MoSe_2$ or $WSe_2$). Channel layer 213 may be of other materials, including TMD and other 2D materials. The thickness of channel layer 213 is less than 1 nm.

Gate electrodes 331 are between and coupled to nanoribbons 210 and include a conductive material, such as titanium nitride (TiN), as do top and back gate electrodes 332, 330. Gate dielectrics 321 are between each of nanoribbons 210 and gate electrodes 331. Gate dielectrics 321 include a high-k dielectric material, such as a hafnium oxide (e.g., $HfO_2$).

In the example of FIG. 3H, interface layers 211, 212 are both hexagonal AlN with an in-plane lattice constant of 3.13 Å. Channel layers 213 (of $WS_2$) have a lattice constant (of ~3.19 Å) substantially matched to a lattice constant of layers 211, 212. In some embodiments, channel layers 213 (of $MoS_2$) have a lattice constant (of ~3.19 Å) substantially matched to a lattice constant of layers 211, 212. In some embodiments, channel layers 213 (of $MoSe_2$ or $WSe_2$) have a lattice constant (of less than 3.3 Å) approximately matched to a lattice constant of layers 211, 212. In some embodiments, one of interface layers 211, 212 is aluminum nitride doped with scandium (e.g., $Al_xSc_{1-x}N$). In some embodiments, both of interface layers 211, 212 is aluminum scandium nitride.

IC die 200 is coupled through host component 399 to a power supply. Host component 399 may be any, e.g., substrate with interconnect interfaces to couple to, such as a package substrate or interposer, another IC die, etc. Host component 399 may itself be a die. Host component 399 may bond to another host component, such as a package substrate or interposer, another IC die, etc. In some embodiments, host component 399 includes a crystalline material, such as silicon. Host component 399 might be in singulated chip form, in wafer form, or in another form.

Figure 4:
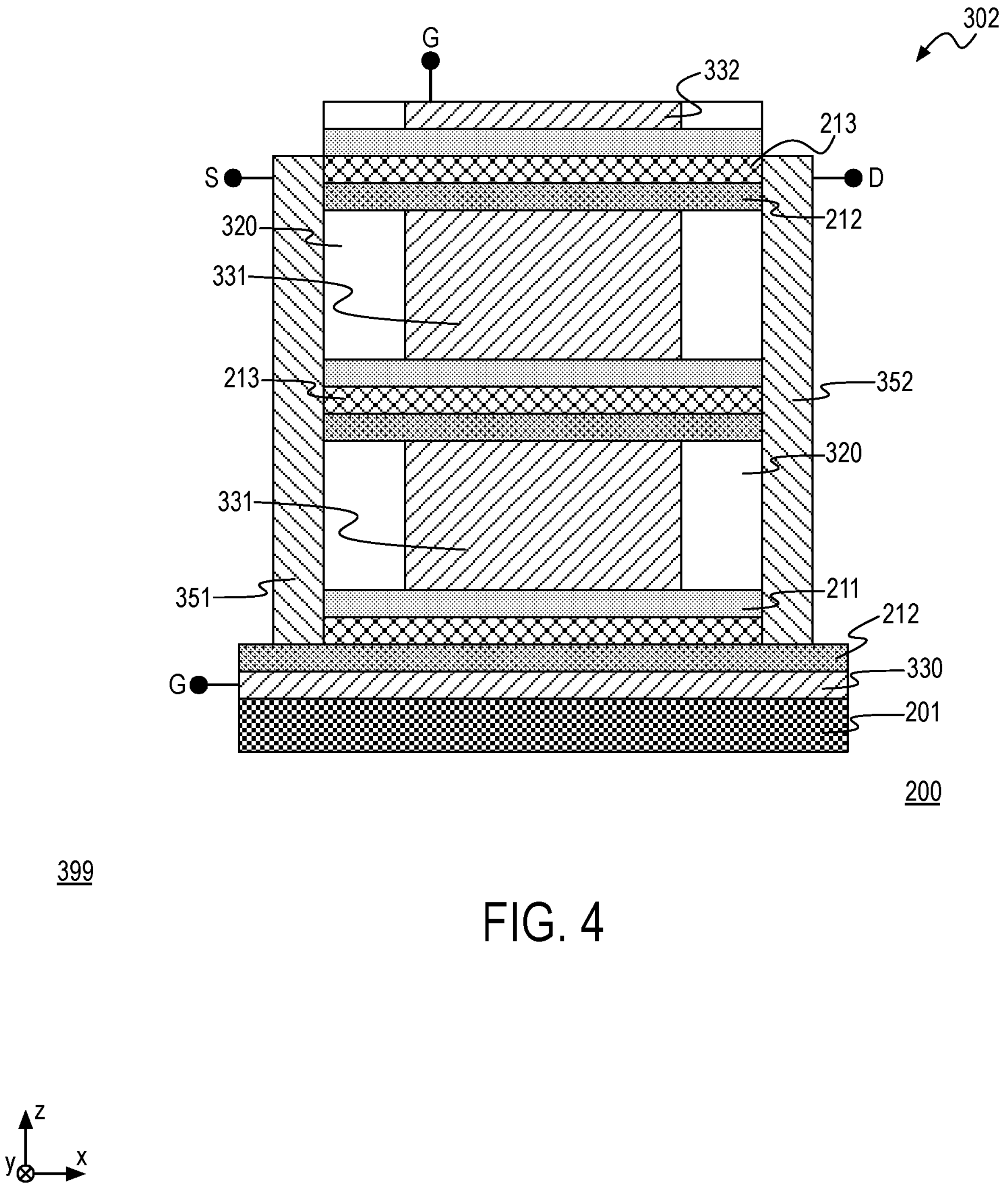
FIG. 4 illustrates a cross-sectional profile view of an IC die and transistor structure, including nanoribbons with 2D material-based channel layers and interface layers between source and drain terminals.

FIG. 4 illustrates a cross-sectional profile view of an IC die 200 and transistor structure 302, including nanoribbons 210 with 2D material-based channel layers 213 and interface layers 211, 212 between source and drain terminals 351, 352, in accordance with some embodiments. FIG. 4 shows transistor structure 302 similar to that of FIG. 3H, but with interface layers 211, 212 serving as a gate dielectric (or ferroelectric). Interface layers 211 are substantially monocrystalline layers of AlN. Interface layers 212 are substantially monocrystalline layers of scandium-doped AlN (e.g., $Al_xSc_{1-x}N$).

Figure 5:
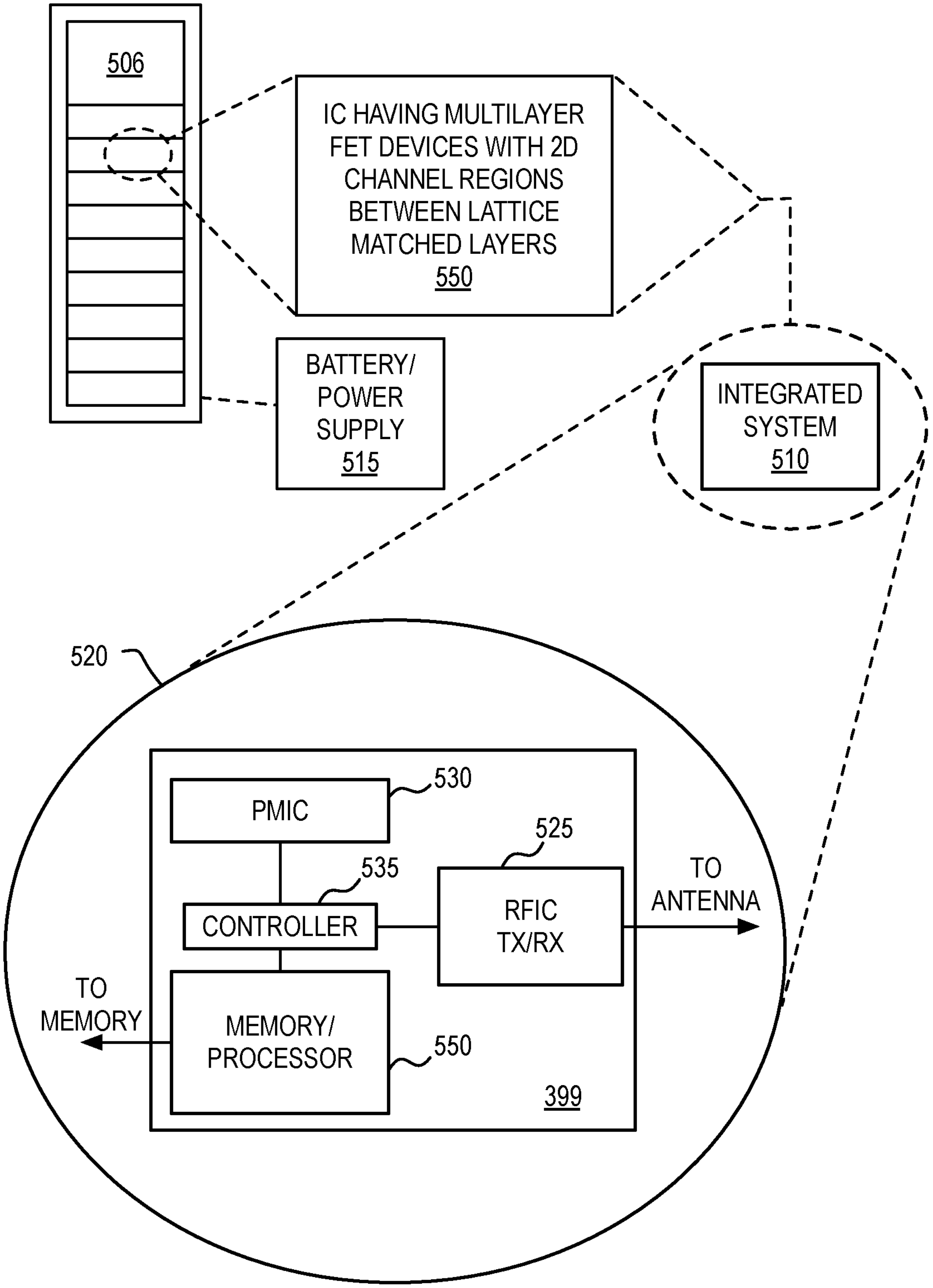
FIG. 5 illustrates a diagram of an example data server machine employing an IC device having a 2D channel layer between lattice-match interface layers.

FIG. 5 illustrates a diagram of an example data server machine 506 employing an IC device having a 2D channel layer between lattice-match interface layers, in accordance with some embodiments. Server machine 506 may be any commercial server, for example, including any number of high-performance computing platforms disposed within a rack and networked together for electronic data processing, which in the exemplary embodiment includes one or more devices 550 having an IC device with a 2D channel layer between lattice-match interface layers.

Server machine 506 includes a battery and/or power supply 515 to provide power to devices 550, and to provide, in some embodiments, power delivery functions such as power regulation. Devices 550 may be deployed as part of a package-level integrated system 510. Integrated system 510 is further illustrated in the expanded view 520. In the exemplary embodiment, devices 550 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 550 is a microprocessor including an SRAM cache memory. As shown, device 550 may include an IC device having a 2D channel layer between lattice-match interface layers, as discussed herein. Device 550 may be further coupled to (e.g., communicatively coupled to) a board, an interposer, or host component 399 along with, one or more of a power management IC (PMIC) 530, RF (wireless) IC (RFIC) 525, including a wideband RF (wireless) transmitter and/or receiver (TX/RX) (e.g., including a digital baseband and an analog front end module further includes a power amplifier on a transmit path and a low noise amplifier on a receive path), and a controller 535 thereof. In some embodiments, RFIC 525, PMIC 530, controller 535, and device 550 include an IC device having a 2D channel layer between lattice-matched interface layers.

Figure 6:
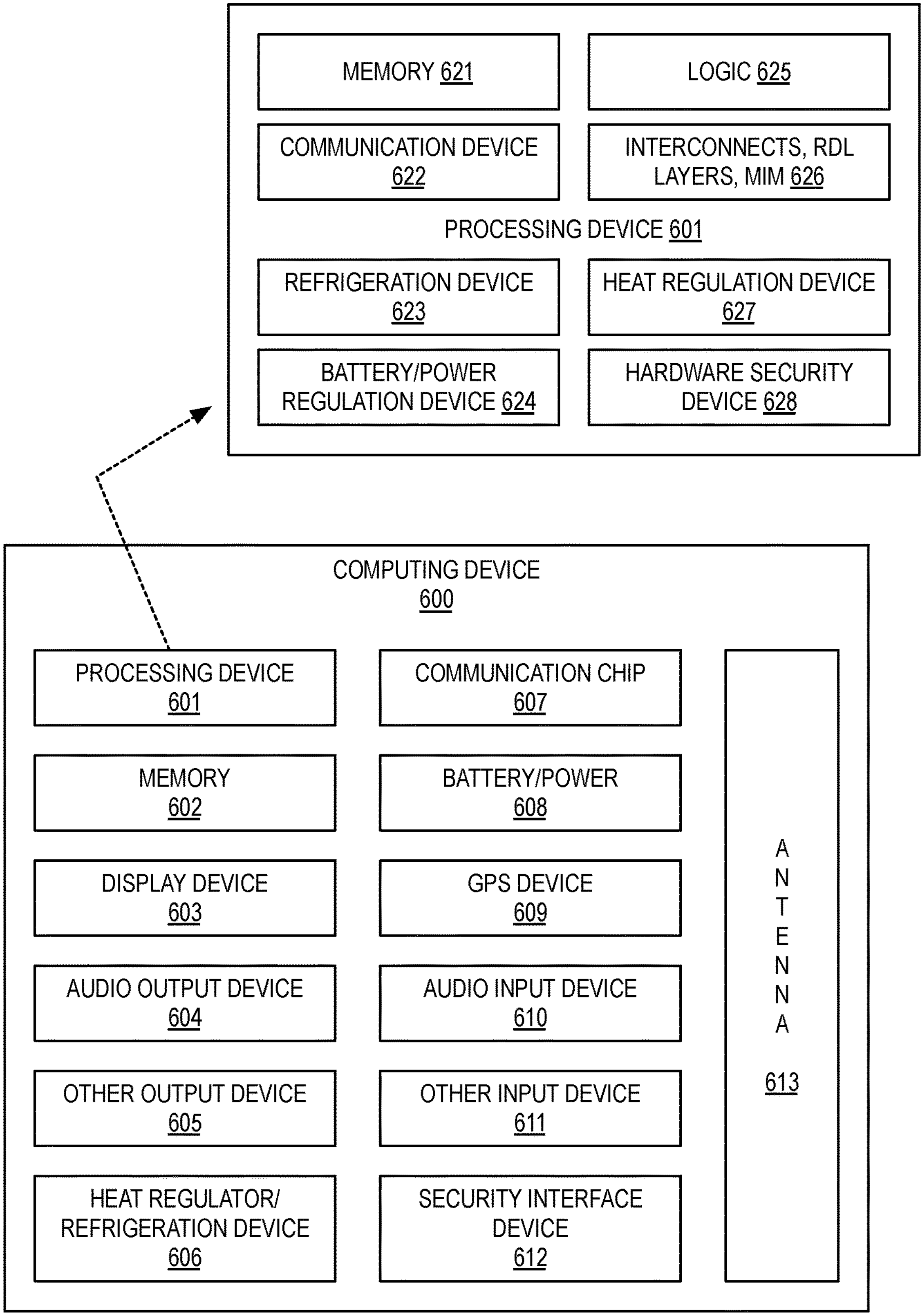
FIG. 6 is a block diagram of an example computing device, all in accordance with some embodiments.

FIG. 6 is a block diagram of an example computing device 600, in accordance with some embodiments. For example, one or more components of computing device 600 may include any of the devices or structures discussed herein. A number of components are illustrated in FIG. 6 as being included in computing device 600, but any one or more of these components may be omitted or duplicated, as suitable for the application. In some embodiments, some or all of the components included in computing device 600 may be attached to one or more printed circuit boards (e.g., a motherboard). In some embodiments, various ones of these components may be fabricated onto a single system-on-a-chip (SoC) die. Additionally, in various embodiments, computing device 600 may not include one or more of the components illustrated in FIG. 6, but computing device 600 may include interface circuitry for coupling to the one or more components. For example, computing device 600 may not include a display device 603, but may include display device interface circuitry (e.g., a connector and driver circuitry) to which display device 603 may be coupled. In another set of examples, computing device 600 may not include an audio output device 604, other output device 605, global positioning system (GPS) device 609, audio input device 610, or other input device 611, but may include audio output device interface circuitry, other output device interface circuitry, GPS device interface circuitry, audio input device interface circuitry, audio input device interface circuitry, to which audio output device 604, other output device 605, GPS device 609, audio input device 610, or other input device 611 may be coupled.

Computing device 600 may include a processing device 601 (e.g., one or more processing devices). As used herein, the term "processing device" or "processor" indicates a device that processes electronic data from registers and/or memory to transform that electronic data into other electronic data that may be stored in registers and/or memory (e.g., SRAM). Processing device 601 may include a memory 621, a communication device 622, a refrigeration device 623, a battery/power regulation device 624, logic 625, interconnects 626 (i.e., optionally including redistribution layers (RDL) or metal-insulator-metal (MIM) devices), a heat regulation device 627, and a hardware security device 628.

Processing device 601 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 600 may include a memory 602, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 602 includes memory that shares a die with processing device 601. This memory may be used as cache memory and may include embedded dynamic random-access memory (eDRAM) or spin transfer torque magnetic random-access memory (STT-M RAM).

Computing device 600 may include a heat regulation/refrigeration device 606. Heat regulation/refrigeration device 606 may maintain processing device 601 (and/or other components of computing device 600) at a predetermined low temperature during operation.

In some embodiments, computing device 600 may include a communication chip 607 (e.g., one or more communication chips). For example, the communication chip 607 may be configured for managing wireless communications for the transfer of data to and from computing device 600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 607 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 607 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network.

Communication chip 607 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 607 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 607 may operate in accordance with other wireless protocols in other embodiments. Computing device 600 may include an antenna 613 to facilitate wireless communications and/or to receive other wireless communications (such as AM or FM radio transmissions).

In some embodiments, communication chip 607 may manage wired communications, such as electrical, optical, or any other suitable communication protocols (e.g., the Ethernet). As noted above, communication chip 607 may include multiple communication chips. For instance, a first communication chip 607 may be dedicated to shorter-range wireless communications such as Wi-Fi or Bluetooth, and a second communication chip 607 may be dedicated to longer-range wireless communications such as GPS, EDGE, GPRS, CDMA, WiMAX, LTE, EV-DO, or others. In some embodiments, a first communication chip 607 may be dedicated to wireless communications, and a second communication chip 607 may be dedicated to wired communications.

Computing device 600 may include battery/power circuitry 608. Battery/power circuitry 608 may include one or more energy storage devices (e.g., batteries or capacitors) and/or circuitry for coupling components of computing device 600 to an energy source separate from computing device 600 (e.g., AC line power).

Computing device 600 may include a display device 603 (or corresponding interface circuitry, as discussed above). Display device 603 may include any visual indicators, such as a heads-up display, a computer monitor, a projector, a touchscreen display, a liquid crystal display (LCD), a light-emitting diode display, or a flat panel display, for example.

Computing device 600 may include an audio output device 604 (or corresponding interface circuitry, as discussed above). Audio output device 604 may include any device that generates an audible indicator, such as speakers, headsets, or earbuds, for example.

Computing device 600 may include an audio input device 610 (or corresponding interface circuitry, as discussed above). Audio input device 610 may include any device that generates a signal representative of a sound, such as microphones, microphone arrays, or digital instruments (e.g., instruments having a musical instrument digital interface (MIDI) output).

Computing device 600 may include a GPS device 609 (or corresponding interface circuitry, as discussed above). GPS device 609 may be in communication with a satellite-based system and may receive a location of computing device 600, as known in the art.

Computing device 600 may include other output device 605 (or corresponding interface circuitry, as discussed above). Examples of the other output device 605 may include an audio codec, a video codec, a printer, a wired or wireless transmitter for providing information to other devices, or an additional storage device.

Computing device 600 may include other input device 611 (or corresponding interface circuitry, as discussed above). Examples of the other input device 611 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 600 may include a security interface device 612. Security interface device 612 may include any device that provides security measures for computing device 600 such as intrusion detection, biometric validation, security encode or decode, access list management, malware detection, or spyware detection.

Computing device 600, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-6. The subject matter may be applied to other deposition applications, as well as any appropriate manufacturing application, as will be understood to those skilled in the art.

The following examples pertain to further embodiments, and specifics in the examples may be used anywhere in one or more embodiments. [reserved for embodiments reflecting the claims]

In one or more first embodiments, a transistor structure includes a source terminal and a drain terminal, a nanoribbon between and coupled to the source and drain terminals, wherein the nanoribbon includes a channel layer, a first crystalline layer, and a second crystalline layer, wherein the channel layer is between the first crystalline layer and the second crystalline layer, the channel layer including a metal and a chalcogen, a gate electrode material adjacent the nanoribbon, and a gate insulator layer between the nanoribbon and the gate electrode material.

In one or more second embodiments, further to the first embodiments, the channel layer includes a crystalline material.

In one or more third embodiments, further to the first or second embodiments, the channel layer has a lattice constant approximately matched to a lattice constant of the first or second crystalline layer.

In one or more fourth embodiments, further to the first through third embodiments, the channel layer has a lattice constant substantially matched to a lattice constant of the first or second crystalline layer.

In one or more fifth embodiments, further to the first through fourth embodiments, the first and second crystalline layers have substantially the same composition and crystalline structure.

In one or more sixth embodiments, further to the first through fifth embodiments, the first and second crystalline layers include aluminum and nitrogen.

In one or more seventh embodiments, further to the first through sixth embodiments, the second crystalline layer includes scandium.

In one or more eighth embodiments, further to the first through seventh embodiments, the channel layer has a thickness of less than 1 nm.

In one or more ninth embodiments, further to the first through eighth embodiments, the metal is tungsten or molybdenum, and the chalcogen is sulfur or selenium.

In one or more tenth embodiments, an integrated circuit (IC) device includes an IC die including a transistor, the transistor including a source terminal and a drain terminal, a plurality of nanoribbons between and coupled to the source and drain terminals, wherein individual ones of the nanoribbons include a channel layer between a first crystalline layer and a second crystalline layer, the channel layer including a metal and a chalcogen, a gate electrode material between and coupled to individual ones of the nanoribbons, and a gate insulator layer between individual ones of the nanoribbons and the gate electrode material, and a power supply coupled to the IC die.

In one or more eleventh embodiments, further to the tenth embodiments, the channel layer includes a crystalline material with a lattice constant substantially matched to a lattice constant of the first or second crystalline layer.

In one or more twelfth embodiments, further to the tenth or eleventh embodiments, the metal is tungsten or molybdenum.

In one or more thirteenth embodiments, further to the tenth through twelfth embodiments, the first and second crystalline layers include aluminum and nitrogen.

In one or more fourteenth embodiments, further to the tenth through thirteenth embodiments, the channel layer has a thickness of less than 1 nm.

In one or more fifteenth embodiments, further to the tenth through fourteenth embodiments, the first or second crystalline layers include scandium.

In one or more sixteenth embodiments, a method includes receiving a substrate, forming a stack of alternating nanoribbons and sacrificial layers on the substrate, wherein individual ones of the nanoribbons include a channel layer between crystalline layers, the channel layers including a metal and a chalcogen, forming a first terminal contacting a first end of a channel layer and a second terminal contacting a second end of a channel layer, creating a void between nanoribbons by removing at least a portion of an individual one of the sacrificial layers, depositing an insulating material in the void, and forming an electrode material in the void.

In one or more seventeenth embodiments, further to the sixteenth embodiments, forming the stack includes epitaxially growing an individual one of the channel layers on an individual one of the crystalline layers.

In one or more eighteenth embodiments, further to the sixteenth or seventeenth embodiments, forming the stack includes growing a crystalline layer on an individual one of the sacrificial layers.

In one or more nineteenth embodiments, further to the sixteenth through eighteenth embodiments, an individual one of the channel layers is a crystalline material with a lattice constant substantially matched to a lattice constant of an individual one of the crystalline layers.

In one or more twentieth embodiments, further to the sixteenth through nineteenth embodiments, an individual one of the crystalline layers includes aluminum and nitrogen.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A transistor structure, comprising:
- a source terminal and a drain terminal;
- a nanoribbon between and coupled to the source terminal and the drain terminal, wherein the nanoribbon comprises a channel layer, a first crystalline layer, and a second crystalline layer, the channel layer is between the first crystalline layer and the second crystalline layer, the channel layer comprises a metal and a chalcogen, and the channel layer has a lattice constant approximately matched to a lattice constant of the first crystalline layer or the second crystalline layer;
- a gate electrode material adjacent the nanoribbon; and
- a gate insulator layer between the nanoribbon and the gate electrode material.

2. The transistor structure of claim 1, wherein the lattice constant of the channel layer is substantially matched to the lattice constant of the first crystalline layer or the second crystalline layer.

3. The transistor structure of claim 1, wherein the first crystalline layer and the second crystalline layer have substantially the same composition and crystalline structure.

4. The transistor structure of claim 1, wherein the first crystalline layer and the second crystalline layer comprise aluminum and nitrogen.

5. The transistor structure of claim 4, wherein the second crystalline layer comprises scandium.

6. The transistor structure of claim 1, wherein the channel layer has a thickness of less than 1 nm.

7. The transistor structure of claim 1, wherein the metal is tungsten or molybdenum, and the chalcogen is sulfur or selenium.

8. The transistor structure of claim 1, further comprising:
- an integrated circuit die comprising the source terminal, the drain terminal, the nanoribbon, the gate electrode material, and the gate insulator layer; and
- a power supply coupled to the integrated circuit die.

9. A transistor structure, comprising:
- a source terminal and a drain terminal;

a nanoribbon between and coupled to the source terminal and the drain terminal, wherein the nanoribbon comprises a channel layer, a first crystalline layer, and a second crystalline layer, the channel layer is between the first crystalline layer and the second crystalline layer, the channel layer comprises a metal and a chalcogen, and the first crystalline layer and the second crystalline layer comprise aluminum and nitrogen;

a gate electrode material adjacent the nanoribbon; and a gate insulator layer between the nanoribbon and the gate electrode material.

10. The transistor structure of claim 9, wherein the channel layer comprises a crystalline material.

11. The transistor structure of claim 9, wherein the first crystalline layer and the second crystalline layer have substantially the same composition and crystalline structure.

12. The transistor structure of claim 9, wherein the second crystalline layer comprises scandium.

13. The transistor structure of claim 9, wherein the channel layer has a thickness of less than 1 nm.

14. The transistor structure of claim 9, further comprising:

an integrated circuit die comprising the source terminal, the drain terminal, the nanoribbon, the gate electrode material, and the gate insulator layer; and a power supply coupled to the integrated circuit die.

15. A transistor structure, comprising:

a source terminal and a drain terminal;

a nanoribbon between and coupled to the source terminal and the drain terminal, wherein the nanoribbon comprises a channel layer, a first crystalline layer, and a second crystalline layer, the channel layer is between the first crystalline layer and the second crystalline layer, the channel layer comprises a metal and a chalcogen, and the channel layer has a thickness of less than 1 nm;

a gate electrode material adjacent the nanoribbon; and a gate insulator layer between the nanoribbon and the gate electrode material.

16. The transistor structure of claim 15, wherein the channel layer comprises a crystalline material.

17. The transistor structure of claim 15, wherein the first crystalline layer and the second crystalline layer have substantially the same composition and crystalline structure.

18. The transistor structure of claim 15, wherein the first crystalline layer and the second crystalline layer comprise aluminum and nitrogen.

19. The transistor structure of claim 18, wherein the second crystalline layer comprises scandium.

20. The transistor structure of claim 18, further comprising:

an integrated circuit die comprising the source terminal, the drain terminal, the nanoribbon, the gate electrode material, and the gate insulator layer; and a power supply coupled to the integrated circuit die.

* * * * *